United States Patent
Hu et al.

(10) Patent No.: US 12,021,090 B2
(45) Date of Patent: Jun. 25, 2024

(54) CURVED DISPLAY MODULE

(71) Applicant: WUHAN CHINA STAR OPTOELECTRONICS SEMICONDUCTOR DISPLAY TECHNOLOGY CO., LTD., Wuhan (CN)

(72) Inventors: Li Hu, Wuhan (CN); Bingkun Yin, Wuhan (CN); Liang Sun, Wuhan (CN)

(73) Assignee: WUHAN CHINA STAR OPTOELECTRONICS SEMICONDUCTOR DISPLAY TECHNOLOGY CO., LTD, Wuhan (CN)

( * ) Notice: Subject to any disclaimer, the term of this patent is extended or adjusted under 35 U.S.C. 154(b) by 0 days.

(21) Appl. No.: 17/598,290

(22) PCT Filed: Sep. 2, 2021

(86) PCT No.: PCT/CN2021/116205
§ 371 (c)(1),
(2) Date: Sep. 26, 2021

(87) PCT Pub. No.: WO2023/015626
PCT Pub. Date: Feb. 16, 2023

(65) Prior Publication Data
US 2024/0047477 A1    Feb. 8, 2024

(30) Foreign Application Priority Data
Aug. 12, 2021 (CN) .......... 202110924468.X (51) Int. Cl.
*H01L 27/12* (2006.01)
*H01L 25/075* (2006.01)
(Continued)

(52) U.S. Cl.
CPC ...... *H01L 27/1244* (2013.01); *H01L 25/0753* (2013.01); *H01L 25/167* (2013.01); *H01L 33/62* (2013.01)

(58) Field of Classification Search
CPC ............ H01L 27/1244; H01L 25/0753; H01L 25/167; H01L 33/62; H01L 27/156;
(Continued)

(56) References Cited

U.S. PATENT DOCUMENTS

2014/0138637 A1\*  5/2014  Yang ............... H01L 27/1244
                                              257/40
2016/0049602 A1\*  2/2016  Kim ................ H10K 59/12
                                              257/40
(Continued)

FOREIGN PATENT DOCUMENTS

CN    110444112 A    11/2019
CN    111221163 A    6/2020
(Continued)

OTHER PUBLICATIONS

Chinese Office Action issued in corresponding Chinese Patent Application No. 202110924468.X dated Apr. 8, 2022, pp. 1-9.
(Continued)

*Primary Examiner* — Victor A Mandala
(74) *Attorney, Agent, or Firm* — PV IP PC; Wei Te Chung; Zhigang Ma (57) ABSTRACT

A curved display module is provided, which includes a stretchable display panel and a first support layer. The stretchable display panel includes a plurality of pixel islands and a connection bridge configured for connecting adjacent two of the pixel islands. A stretching degree of the connection bridge in the first stretching area is less than a stretching degree of the connection bridge in the second stretching area. A four-sided curved 3D stereo display panel is realized (Continued)

by the present disclosure, and the risk of distortion and deformation of the display panel during stretching is reduced as well.

20 Claims, 6 Drawing Sheets

(51) Int. Cl.
*H01L 25/16* (2023.01)
*H01L 33/62* (2010.01)

(58) Field of Classification Search
CPC ... H01L 33/483; H01L 27/1214; H01L 33/52; G09F 9/301; G09F 9/33; H10K 59/12
See application file for complete search history.

(56) References Cited

U.S. PATENT DOCUMENTS

| | | |
|---|---|---|
| 2018/0052493 A1 | 2/2018 | Hong |
| 2019/0296097 A1 | 9/2019 | Hong |
| 2019/0341433 A1* | 11/2019 | Im ................... H10K 59/131 |
| 2020/0027945 A1 | 1/2020 | Kim |
| 2020/0137472 A1 | 4/2020 | Won |
| 2021/0028155 A1* | 1/2021 | Kim .................... H05K 1/0283 |
| 2021/0056873 A1* | 2/2021 | Jung .................. H10K 59/121 |
| 2021/0063610 A1* | 3/2021 | Zhu ..................... G06F 1/1652 |
| 2021/0135133 A1* | 5/2021 | Zhu ................... H10K 59/131 |
| 2021/0135154 A1 | 5/2021 | Liu |
| 2021/0256900 A1* | 8/2021 | Wu .......................... G09F 9/33 |
| 2022/0139888 A1* | 5/2022 | Kim ................... H01L 25/0753 |
| | | 257/89 |

FOREIGN PATENT DOCUMENTS

| | | |
|---|---|---|
| CN | 111462637 A | 7/2020 |
| CN | 111584606 A | 8/2020 |
| CN | 111682049 A | 9/2020 |
| CN | 111968522 A | 11/2020 |
| CN | 112002234 A | 11/2020 |
| CN | 112002237 A | 11/2020 |
| CN | 112068236 A | 12/2020 |
| CN | 112310123 A | 2/2021 |
| CN | 112397559 A | 2/2021 |
| CN | 112750363 A | 5/2021 |
| CN | 112863342 A | 5/2021 |
| JP | 2020086425 A | 6/2020 |

OTHER PUBLICATIONS

International Search Report in International application No. PCT/CN2021/116205, dated Mar. 29, 2022.
Written Opinion of the International Searching Authority in International application No. PCT/CN2021/116205, dated Mar. 29, 2022.
Chinese Office Action issued in corresponding Chinese Patent Application No. 202110924468.X dated Oct. 20, 2022, pp. 1-5.
Chinese Decision of Rejection issued in corresponding Chinese Patent Application No. 202110924468.X dated Feb. 11, 2023, pp. 1-5.
Japanese Office Action issued in corresponding Japanese Patent Application No. 特願2022-502956 dated Oct. 10, 2023, pp. 1-7.
Korean Office Action issued in corresponding Korean Patent Application No. 10-2021-7034618 dated Aug. 30, 2023, pp. 1-6.

* cited by examiner

CURVED DISPLAY MODULE

RELATED APPLICATIONS

This application is a Notional Phase of PCT Patent Application No. PCT/CN2021/116205 having international filing date of Sep. 2, 2021, which claims the benefit of priority of Chinese Patent Application No. 20210924468.X filed on a Aug. 12, 2021. The contents of the above applications are all incorporated by reference as if fully set forth herein in their entirety.

FIELD OF INVENTION

The present disclosure relates to the field of display technology, and more particularly, to a curved display module.

BACKGROUND OF INVENTION

With the development of Internet of Things technology, consumer electronics may be more and more integrated into our life. Since these objects are usually not necessarily 2D, there are requirements for developing 3D free-curved display technology. However, for foldable and flexible display screens, the display function is only realized in a certain spatial direction, and the effect of flexible display in any direction of the overall dimensions cannot be realized. Therefore, researching curved display modules for realizing multi-directional stretching and still ensuring excellent display effect is the focus of the research on the next generation of new overall dimension flexible display.

How to both achieve great stretching rates of the curved display modules and retain great strength for avoiding the fracture and restraining the distortion and deformation of the display panel during stretching are still one of the difficulties in the research and development of the curved display devices.

SUMMARY OF INVENTION

Technical Problem

The embodiments of the present disclosure provide a curved display module to solve the technical problem of the fracture or the distortion and deformation of the display panel when realizing great stretching rates in various directions in a conventional curved display module.

Technical Solutions

In order to solve the aforementioned problem, the technical solutions are provided in the present disclosure as below:

A curved display module including a display area is provided in the embodiments of the present disclosure, wherein the curved display module includes:
a stretchable display panel including a plurality of pixel islands configured for carrying light-emitting units and a connection bridge configured for connecting adjacent two of the pixel islands; and
a first support layer disposed on a first side of the stretchable display panel;
wherein the display area includes a first stretching area and a second stretching area, when the curved display module is not subjected to an external force, a stretching degree of the connection bridge in the first stretching area is less than a stretching degree of the connection bridge in the second stretching area;
when the curved display module is not subjected to the external force, a distance between the adjacent two of the pixel islands in the first stretching area is less than a distance between the adjacent two of the pixel islands in the second stretching area;
when the curved display module is not subjected to the external force, a stretching degree of a portion of the first support layer located in the first stretching area is less than a stretching degree of a portion of the first support layer located in the second stretching area.

In some embodiments of the present disclosure, a length of the connection bridge between the adjacent two of the pixel islands in the first stretching area is equal to a length of the connection bridge between the adjacent two of the pixel islands in the second stretching area.

In some embodiments of the present disclosure, a plurality of connection lines are disposed on the connection bridge, and the connection lines are electrically connected with pixel driving circuits in the adjacent two of the pixel islands, wherein when the curved display module is not subjected to the external force, stretching degrees of the connection lines in the first stretching area are less than stretching degrees of the connection lines in the second stretching area.

In some embodiments of the present disclosure, lengths of the connection lines between the adjacent two of the pixel islands in the first stretching area are equal to lengths of the connection lines between the adjacent two of the pixel islands in the second stretching area.

In some embodiments of the present disclosure, the curved display module further includes:
a second support layer disposed on a second side of the stretchable display panel opposite the first side;
when the curved display module is not subjected to the external force, a stretching degree of a portion of the second support layer located in the first stretching area is less than a stretching degree of a portion of the second support layer located in the second stretching area.

In some embodiments of the present disclosure, the first support layer and the second support layer are thermoplastic substrates.

In some embodiments of the present disclosure, the stretchable display panel includes a substrate disposed on a side of the first support layer, and the substrate includes substrate islands located on the pixel islands, a substrate bridge located on the connection bridge, and a hollow area located between one of the substrate islands and the substrate bridge;
each of the pixel islands includes one of the substrate islands, and a pixel driving circuit and one of the light-emitting units which are stacked on the one of the substrate islands in order;
the connection bridge includes the substrate bridge and a plurality of connection lines disposed on the substrate bridge, and the connection lines are electrically connected with the pixel driving circuits on the adjacent two of the substrate islands.

In some embodiments of the present disclosure, the curved display module further includes a first curing adhesive layer configured for bonding the stretchable display panel and the first support layer, and a second curing adhesive layer configured for bonding the stretchable display panel and the second support layer, wherein at least one of the first curing adhesive layer and the second curing adhesive layer is further filled in the hollow area.

Another curved display module including a display area is provided in the embodiments of the present disclosure, wherein the curved display module includes:
- a stretchable display panel including a plurality of pixel islands configured for carrying light-emitting units and a connection bridge configured for connecting adjacent two of the pixel islands; and
- a first support layer disposed on a first side of the stretchable display panel;
- wherein the display area includes a first stretching area and a second stretching area, when the curved display module is not subjected to an external force, a stretching degree of the connection bridge in the first stretching area is less than a stretching degree of the connection bridge in the second stretching area.

In some embodiments of the present disclosure, when the curved display module is not subjected to the external force, a distance between the adjacent two of the pixel islands in the first stretching area is less than a distance between the adjacent two of the pixel islands in the second stretching area.

In some embodiments of the present disclosure, a length of the connection bridge between the adjacent two of the pixel islands in the first stretching area is equal to a length of the connection bridge between the adjacent two of the pixel islands in the second stretching area.

In some embodiments of the present disclosure, a plurality of connection lines are disposed on the connection bridge, and the connection lines are electrically connected with pixel driving circuits in the adjacent two of the pixel islands, wherein when the curved display module is not subjected to the external force, stretching degrees of the connection lines in the first stretching area are less than stretching degrees of the connection lines in the second stretching area.

In some embodiments of the present disclosure, when the curved display module is not subjected to the external force, a stretching degree of a portion of the first support layer located in the first stretching area is less than a stretching degree of a portion of the first support layer located in the second stretching area In some embodiments of the present disclosure, the curved display module further includes a second support layer disposed on a second side of the stretchable display panel opposite the first side; when the curved display module is not subjected to the external force, a stretching degree of a portion of the second support layer located in the first stretching area is less than a stretching degree of a portion of the second support layer located in the second stretching area.

In some embodiments of the present disclosure, the first support layer and the second support layer are thermoplastic substrates.

In some embodiments of the present disclosure, the stretchable display panel includes a substrate disposed on a side of the first support layer, and the substrate includes substrate islands located on the pixel islands, a substrate bridge located on the connection bridge, and a hollow area located between one of the substrate islands and the substrate bridge. Each of the pixel islands includes one of the substrate islands, and a pixel driving circuit and one of the light-emitting units which are stacked on the one of the substrate islands in order. The connection bridge includes the substrate bridge and a plurality of connection lines disposed on the substrate bridge, and the connection lines are electrically connected with the pixel driving circuits on the adjacent two of the substrate islands.

In some embodiments of the present disclosure, the curved display module further includes a first curing adhesive layer configured for bonding the stretchable display panel and the first support layer, and a second curing adhesive layer configured for bonding the stretchable display panel and the second support layer, wherein at least one of the first curing adhesive layer and the second curing adhesive layer is further filled in the hollow area.

In some embodiments of the present disclosure, an organic filling layer is disposed between the connection lines and the substrate bridge, and one side of the connection lines away from the substrate bridge are covered by an organic layer.

In some embodiments of the present disclosure, the second stretching area surrounds the first stretching area, a stretching degree of the first stretching area is zero, and a stretching degree of the second stretching area is greater than zero.

Beneficial Effect

The curved display module is provided in the embodiments of the present disclosure, which includes a stretchable display panel and a first support layer disposed on a side of the stretchable display panel. The display area of the curved display module includes a first stretching area and a second stretching area. A stretching degree of the connection bridge in the first stretching area is less than a stretching degree of the connection bridge in the second stretching area. When a four-sided curved 3D stereo display panel is realized, the risk of distortion and deformation of the display panel during stretching is reduced as well, thereby enhancing the reliability of the curved display module.

DETAILED DESCRIPTION OF PREFERRED EMBODIMENTS

A curved display module is provided in the present disclosure. In order to make the purpose, technical solution and effect of the present disclosure clearer and more definite, the present disclosure is further described in detail with reference to the attached drawings and embodiments. It should be understood that the specific embodiments described herein are only used to explain the present disclosure and the present disclosure is not limited thereto.

For the technical problem that the fracture or the distortion and deformation of the display panel occurs in the existing curved display module while realizing a great stretching rates, the present embodiment is provided in the present disclosure to overcome the defect.

Figure 1:
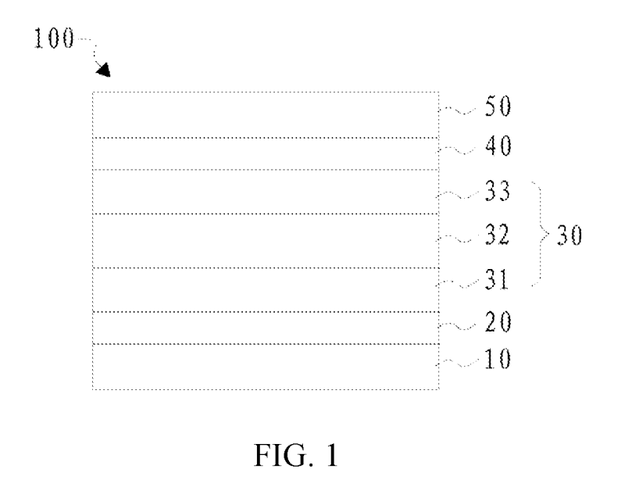
FIG. 1 is a schematic diagram of film layers of a curved display module provided in the embodiments of the present disclosure.

Reference is made to FIG. 1. A curved display module 100 is provided in the embodiments of the present disclosure, which includes a stretchable display panel 30, a second support layer 50, and a first support layer 10. The stretchable display panel 30 includes opposite first and second sides, the first support layer 10 is disposed on the first side of the stretchable display panel 30, and the second support layer 50 is disposed on the second side of the stretchable display panel 30.

Figure 2:
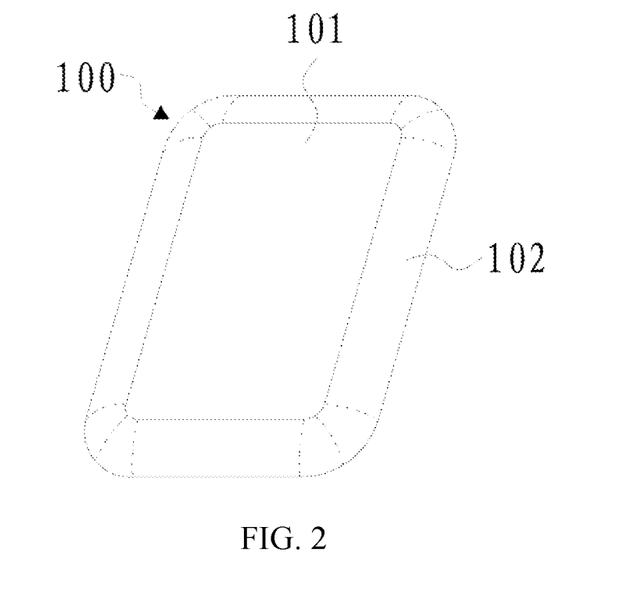
FIG. 2 is a structural diagram of a curved display module provided in the embodiments of the present disclosure.

References are made to FIG. 1 and FIG. 2. The stretchable display panel 30 includes an array of pixel islands 301 and a connection bridge 302 connecting adjacent two of the pixel islands 301. The stretchable display panel 30 includes an array of light-emitting units, and each of the pixel island 301 is provided with at least one light-emitting unit. In the embodiments of the present disclosure, each of the pixel island 301 being provided with one light-emitting unit is taken as an example.

In some embodiments, any of the light-emitting units includes a first sub-pixel, a second sub-pixel, and a third sub-pixel with different colors. The first sub-pixel, the second sub-pixel, and the third sub-pixel are selected from any one of red, green and blue sub-pixels, respectively. In other embodiments, the light-emitting unit may further include a fourth sub-pixel, and the fourth sub-pixel may be a white sub-pixel.

The connection bridge 302 is a bending bridge with at least two different bending directions, so that the stretchable display panel 30 has an excellent stretching effect. When the stretchable display panel 30 is stretched and deformed, the connection bridge 302 thereof is stretched and deformed, and the pixel island 301 is not stretched and deformed. Therefore, the pixel unit located on the pixel island 301 is not affected by the stretching. In order to realize that the pixel unit is not affected by the stretching while stretching the stretchable display panel 30, which prevents the stretchable display panel 30 from being distorted and deformed during stretching, the second support layer 50 and the first support layer 10 are disposed on both sides of the stretchable display panel 30 to enhance the reliability of the stretchable display panel 30 in the embodiments of the present disclosure.

Figure 3:
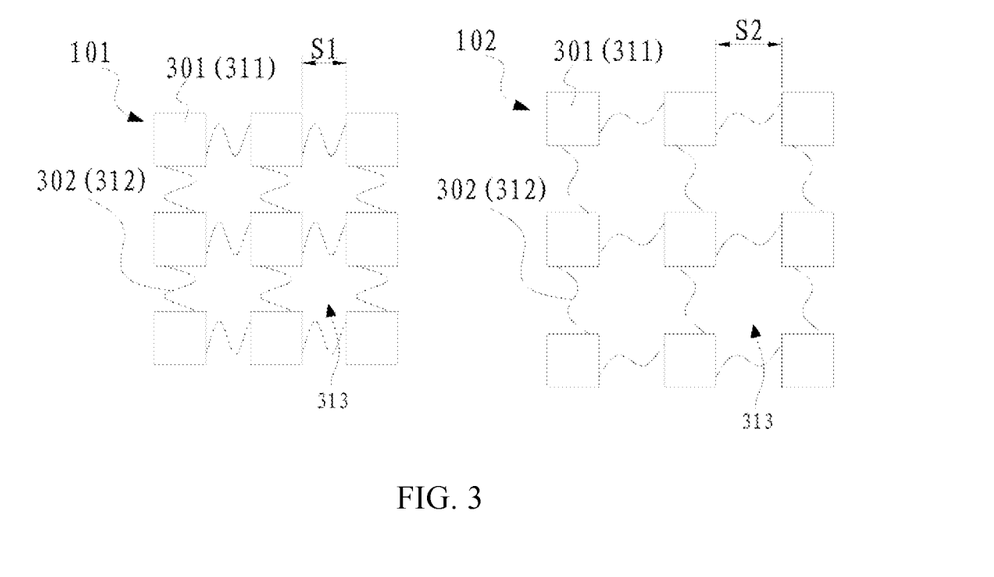
FIG. 3 is a structural diagram of a first stretching area and a second stretching area of a stretchable display panel provided in the embodiments of the present disclosure.

The curved display module 100 includes a display area, and the display area includes a first stretching area 101 and a second stretching area 102. When the curved display module 100 is not subjected to an external force, a stretching degree of the connection bridge 302 in the first stretching area 101 is less than a stretching degree of the connection bridge 302 in the second stretching area 102. The smaller the stretching degree of the connection bridge is, the more the number of the bending portions of the connection bridge, and/or the greater a curvature (bending degree) of the bending portion corresponding to the connection bridge. As shown in FIG. 3, the curvature of a bending portion of the connection bridge 302 in the first stretching area 101 is greater than the curvature of the bending portion corresponding to the connection bridge 302 in the second stretching area 102. That is, the bending degree of the bending portion of the connection bridge 302 in the first stretching area 101 is greater than the bending degree of the bending portion corresponding to the connection bridge 302 in the second stretching area 102.

Reference is made to FIG. 3. In the embodiments of the present disclosure, when the curved display module 100 is not subjected to the external force, a distance S1 between adjacent two of the pixel islands 301 in the first stretching area 101 is less than a distance S2 between the adjacent two of the pixel islands 301 in the second stretching area 102.

Further, a length of the connection bridge 302 between the adjacent two of the pixel islands 301 in the first stretching area 101 is equal to a length of the connection bridge 302 between the adjacent two of the pixel islands 301 in the second stretching area. The length mentioned in the embodiments of the present disclosure refers to the length of the component just in a straightened state.

In the embodiments of the present disclosure, the maximum stretching strength of each of the connection bridges in the curved display module 100 is the same. When the curved display module 100 is not subjected to the external force, the stretching degree of the connection bridge 302 in the first stretching area 101 is less than the stretching degree of the connection bridge 302 in the second stretching area 102. That is, the remaining stretchability of the connection bridge 302 in the first stretching area 101 is greater than the remaining stretchability of the connection bridge 302 in the second stretching area 102. The maximum stretching strength refers to the maximum stress value of a material when the material is stretched to be fractured, which characterizes the ability of a material or component against the damage under the tension.

The second support layer 50 and the first support layer 10 are respectively disposed on the opposite sides of the stretchable display panel 30 to support the stretchable display panel 30, thereby enhancing the strength of the stretchable display panel and reducing the risk of the distortion and deformation of the stretchable display panel 30 during stretching. The number of the first stretching area 101 and the number of the second stretching area 102 are not limited, which may be one, two, or numerous.

Before the stretchable display panel 30 is bonded with the first support layer 10 and the second support layer 50, the stretchable display panel 30 serves as a singular component, and the stretchable deformation ability of each of the connection bridges 302 in the display area is the same. That is, the stretching degree of each of the connection bridges 302 in the display area is the same. After bonding with the first support layer 10 and the second support layer 50, since a stereo curved display module 100 is required to be formed by stretching in entirety, the corresponding areas of the stretchable display panel 30 are required to be stretched in different degrees to realize the effect of stereo curved display. The first stretching area 101 and the second stretching area 102 are formed in the stretchable display panel 30 after stretching. The stretchable deformation ability of each of the connection bridges is the same before stretching. Therefore, after the curved display module 100 is formed by stretching, the greater the stretching degree of the connection bridge is, the greater the corresponding deformation degree.

The first support layer 10 and the second support layer 50 should maintain non-stretchable characteristic and have certain rigidity under normal use (normal temperature or room temperature, free from the external force), so as to enhance the reliability of the curved display module.

The first support layer 10 and the second support layer 50 are both thermoplastic substrates. The thermoplastic substrate can flow, deform, be soften or melt into any shape during heating, and be cured to keep the shape after cooling, which facilitates manufacturing the curved display module 100 with the fixed curvature. The entirety formed by bonding the stretchable display panel 30 with the second support layer 50 and the first support layer 10 can form a static display device with the fixed curvature through a thermoforming process.

Specifically, the materials of the second support layer 50 and the first support layer 10 include any one of amorphous polyethylene terephthalate (A-PET), polymethylmethacrylate (PMMA), polycarbonate (PC), and polypropylene (PP).

Reference is made to FIG. 1. The stretchable display panel 30 includes a substrate 31, pixel driving circuits 32 disposed on the substrate 31, and light-emitting units 33 disposed on the pixel driving circuit 32, wherein the pixel driving circuit 32 and the light-emitting unit 33 are located in the pixel island 301.

Figure 4:
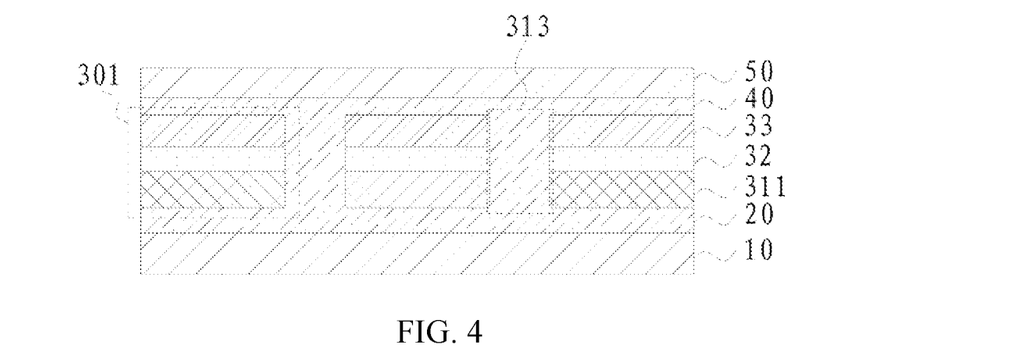
FIG. 4 is a schematic cross-sectional view of a curved display module provided in the embodiments of the present disclosure.

References are made to FIG. 3 and FIG. 4. FIG. 3 is a plan view of the stretchable display panel in the first stretching area and the second stretching area in FIG. 2, and FIG. 4 is a cross-sectional view of the curved display module. The substrate 31 includes substrate islands 311 located on the pixel islands 301, substrate bridges 312 located on the connection bridges 302, and a hollow area 313 located between the substrate island 311 and the substrate bridge 312. The substrate bridge 312 connects adjacent two of the substrate islands 311.

A plurality of connection lines are disposed on the substrate bridge 312, and the bending direction and extension direction of each of the connection line are the same as those of the substrate bridge 312. When the stretchable display panel 30 is stretched, the substrate bridge 312 is stretched in conjunction with the connection lines thereon. In order to ensure the effective stretching effect and avoid the breakage of line, organic film layers may be disposed on both sides of the connection lines close to the substrate bridge 312 and away from the substrate bridge 312 to alleviate the tensile stress.

When the curved display module 100 is not subjected to the external force, the stretching degree of the connection lines in the first stretching area 101 is less than the stretching degree of the connection lines in the second stretching area 102. The connection line is configured for electrically connecting the pixel driving circuits on the adjacent two of pixel islands 301, and the connection line includes, but not limited to, at least one of the signal lines such as scanning line and data line. Further, lengths of the connection lines between the adjacent two of the pixel islands 301 in the first stretching area 101 are equal to lengths of the connection lines between the adjacent two of the pixel islands 301 in the second stretching area 102.

The hollow area 313 is surrounded by the substrate island 311 and the substrate bridge 312. The substrate in the hollow area 313 is removed to form a substrate of an island-bridge structure, so as to enhance the stretching ability of the stretchable display panel 30. The substrate 31 is a flexible substrate, and the material of the substrate 31 includes, but not limited to, polyimide material.

In the curved display module 100, an area of any hollow area 313 in the first stretching area 101 is less than an area of any hollow area 313 in the second stretching area 102. In the embodiments of the present disclosure, both the first support layer 10 and the second support layer 50 are whole film structure. References are made to FIG. 1 and FIG. 2. The connection bridges of the first stretching area 101 and the second stretching area 102 in the curved display module 100 have different stretching degrees. Accordingly, when the curved display module 100 is not subjected to the external force, the stretching degree of a portion of the first support layer 10 located in the first stretching area 101 is less than the stretching degree of a portion of the first support layer 10 located in the second stretching area 102, and the stretching degree of a portion of the second support layer 50 located in the first stretching area 101 is less than the stretching degree of a portion of the second support layer 50 located in the second stretching area 102.

The pixel driving circuit 32 may include an array of 7T1C (seven thin film transistors and one capacitor) pixel driving circuits. The thin film transistor includes, but not limited to, any one of a low-temperature polysilicon thin film transistor and an oxide thin film transistor. The thin film transistor of the pixel driving circuit 32 includes an active layer 327, a source, a drain, and a gate.

Figure 5:
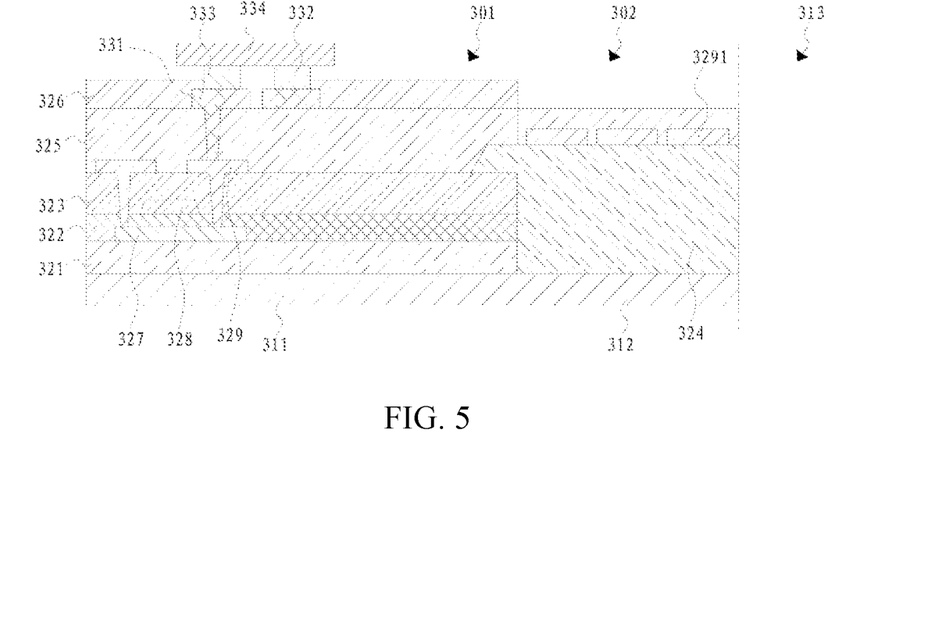
FIG. 5 is a schematic cross-sectional view of a stretchable display panel provided in the embodiments of the present disclosure.

The light-emitting unit 33 includes, but not limited to, any one of an OLED (organic light-emitting diode) light-emitting unit, a mini-LED light-emitting unit, and a mini-LED light-emitting unit. Reference is made to FIG. 5. FIG. 5 is a schematic cross-sectional view of the stretchable display panel. The stretchable display panel 30 includes a buffer layer 321 disposed on the substrate island 311, an active layer 327 disposed on the buffer layer 321, a first insulation layer 322 disposed on the active layer 327, a first metal layer 328 disposed on the first insulation layer 322, a second insulation layer 323 disposed on the first metal layer 328, and a second metal layer 329 disposed on the second insulation layer 323. The first metal layer 328 includes gates of a plurality of thin film transistors formed in the pixel driving circuits 32, and the second metal layer 329 includes sources and drains of a plurality of thin film transistors formed in the pixel driving circuit 32.

All the buffer layer 321, the first insulation layer 322, and the second insulation layer 323 are inorganic layers, and the inorganic layer material may be silicon nitride or silicon oxide. In order not to affect the stretching property of the connection bridge 302, the portions of the buffer layer 321, the first insulation layer 322, and the second insulation layer 323 located on the connection bridge 302 are excavated to form grooves, and the grooves are filled with an organic filling layer 324. The connection line 3291 is formed on the organic filling layer 324. The connection line 3291 may be disposed on the same layer as the source and drain of the pixel driving circuit 32, and is formed by patterning the second metal layer 329.

The second metal layer 329 is covered with a planarization layer 325, and the planarization layer 325 is an organic layer. The planarization layer 325 extends from the pixel island 301 to the connection bridge 302 and covers the connection line 3291. By disposing the organic layers on both the upper and lower sides of the connection line 3291, it is conducive to alleviating the tensile stress.

The substrate 31 in the hollow area 313 and the film layers thereon are all removed, and the hollow area 313 is then filled with an adhesive layer when the first support layer 10 and the second support layer 50 are bonded.

The light-emitting units 33 are disposed on the planarization layer 325. The light-emitting unit 33 is encapsulated independently to prevent the tensile stress on the connection bridge 302 from extending along the packaging layer to the pixel island 301 during stretching, which may affect the light-emitting unit 33.

Specifically, when the light-emitting units 33 are OLED light-emitting units, because the OLED device is sensitive to water vapor, a packaging layer is disposed on the OLED light-emitting units to block the invasion of water and oxygen. The packaging layer includes an inorganic layer and an organic layer which are stacked alternately. The packaging layer is a discontinuous design, which is only located on each of the pixel island 301 and covers the light-emitting unit 33 on the pixel island 301. The packaging layer does not extend to the connection bridge 302, so as to ensure that the light-emitting unit 33 is not affected by stretching.

When the light-emitting units 33 are micro-LED light-emitting units or mini-LED light-emitting units, a LED chip is bound on the substrate island 311 by transfer printing. Since the LED chip is already encapsulated before transfer printing, the independent encapsulation of the light-emitting unit 33 on the stretchable display panel 30 is unnecessary to be considered afterwards.

Due to low resolution of OLED light-emitting units, which are only dozens of PPI, the current market demand cannot be met. Also, thin film packaging in pixel level is required, and the existing technology thereof is immature and has high difficulty and low reliability. Moreover, a fine metal mask (FMM) used for the evaporation of each functional layer of the light-emitting layer is expensive, resulting in the high costs of producing the whole display screen. Therefore, in the present embodiment, the light-emitting units 33 are preferably micro-LED units or mini-LED units. The micro/mini-LEDs are LEDs which are thin-film-formed, miniaturized, and arrayed, so that the size is reduced to tens of microns or even a few microns. High PPI and high brightness may be achieved for the micro/mini-LEDs. In addition, there is no requirement of special packaging processes for the micro/mini-LEDs. The micro/mini-LEDs are made of inorganic materials, which have longer lifespans and higher stability than OLED, and do not tend to the phenomena, such as screen burn and age.

The light-emitting unit 33 includes a first electrode 332 and a second electrode 333. A conductive connection layer 331 is disposed on the planarization layer 325. The first electrode 332 and the second electrode 333 are disposed on the surface of the conductive connection layer 331. The conductive connection layer 331 is electrically connected to the source or drain in the pixel driving circuit 32 through corresponding via hole. A passivation layer 326 is disposed on the planarization layer 325. A via hole is defined on the passivation layer 326 to expose the first electrode 332 and the second electrode 333. The LED chip 334 of the light-emitting unit 33 is disposed on the first electrode 332 and the second electrode 333.

Reference to FIG. 4, the curved display module includes a first curing adhesive layer 20 for bonding the stretchable display panel 30 and the first support layer 10 and a second curing adhesive layer 40 for bonding the stretchable display panel 30 and the second support layer 50. At least one of the first curing adhesive layer 20 and the second curing adhesive layer 40 is filled in the hollow area 313.

A hot bending process is required for forming the curved display module 100. The first curing adhesive layer 20 and the second curing adhesive layer 40 have certain fluidity to be stretched during the hot bending process. The curing is performed after the hot bending process, which provides a certain rigidity to avoid the distortion and deformation of the stretchable display panel. Therefore, the first curing adhesive layer 20 and the second curing adhesive layer 40 are adhesive materials with stretchable properties, which may be, but not limited to, one of stretchable and curable transparent adhesive materials such as optically clear adhesive (OCA) and tical clear resin (OCR).

The curved display module 100 in the embodiments of the present disclosure has a fixed curvature and can be applied to a central console of automobile fields, wearing fields, four-sided curved display fields, and spherical display fields.

Reference is made to FIG. 2. In an embodiment of the present disclosure, the curved display module 100 is a four-sided curved display module, and the second stretching area 102 is arranged around the first stretching area 101. When the curved display module 100 is not subjected to the external force, the stretching degree of the first stretching area 101 is zero, and the stretching degree of the second stretching area 102 is greater than zero.

Figure 6:
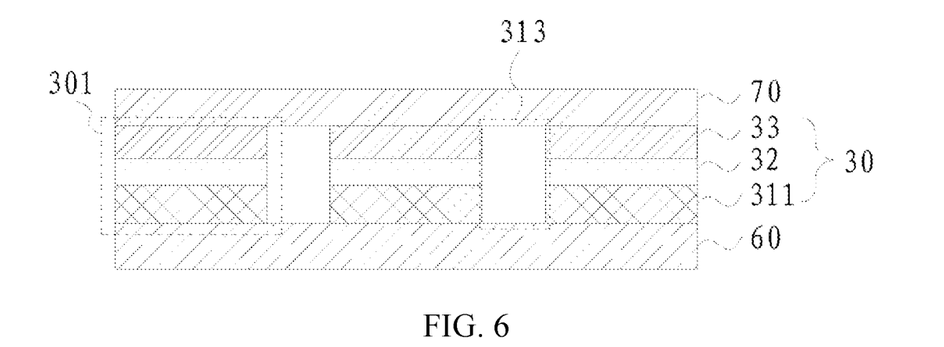
FIG. 6 is a structural diagram of a stretchable display panel during a manufacturing process provided in the embodiments of the present disclosure.

Reference is made to FIG. 6. The substrate 31 of the stretchable display panel 30 is required to be manufactured on the rigid substrate 60 generally. After the pixel driving circuits 32 and the light-emitting units 33 are manufactured, a protective film 70 is required to be attached to the stretchable display panel 30 to protect the stretchable display panel 30 and avoid damage to the stretchable display panel 30 during transfer and transportation.

Figure 7:
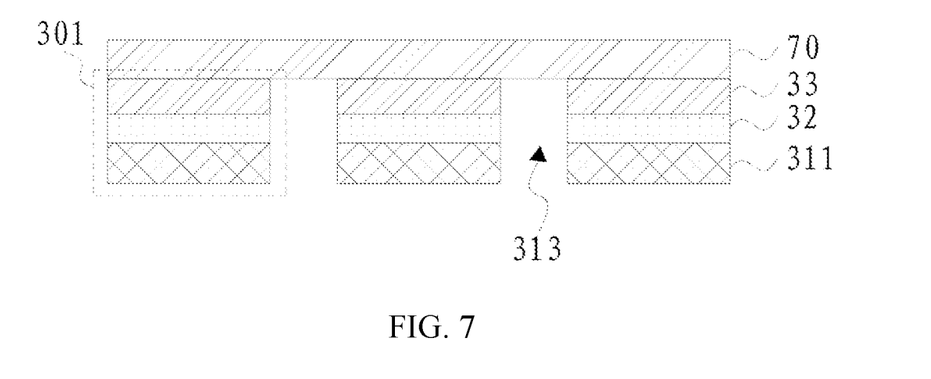
FIG. 7 is a structural diagram of a stretchable display panel after removing a glass substrate provided in the embodiments of the present disclosure.

Reference is made to FIG. 7. After the stretchable display panel 30 is manufactured, the rigid substrate 60 is required to be removed, and the rigid substrate 60 and the stretchable display panel 30 can be stripped by laser stripping.

Figure 8:
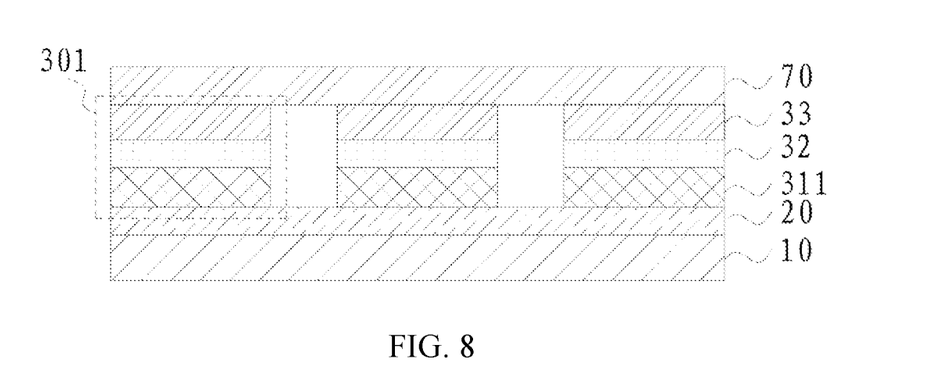
FIG. 8 is a structural diagram of a stretchable display panel bonded with a first support layer provided in the embodiments of the present disclosure.

Reference is made to FIG. 8. After the rigid substrate 60 is removed, the first support layer 10 is bonded to the first side of the stretchable display panel 30 with the first curing adhesive layer 20. Specifically, the first support layer 10 is bonded to the substrate island 311 and the substrate bridge 312 with the first curing adhesive layer 20. At this time, the first curing adhesive layer 20 is not cured yet, and has fluidity and stretching property. In the present embodiment, the first curing adhesive layer 20 may be an OCA transparent adhesive material, in which the OCA has low Young's modulus and excellent stretching property, and the first support layer 10 is preferably thermoplastic A-PET sheet.

Figure 9:
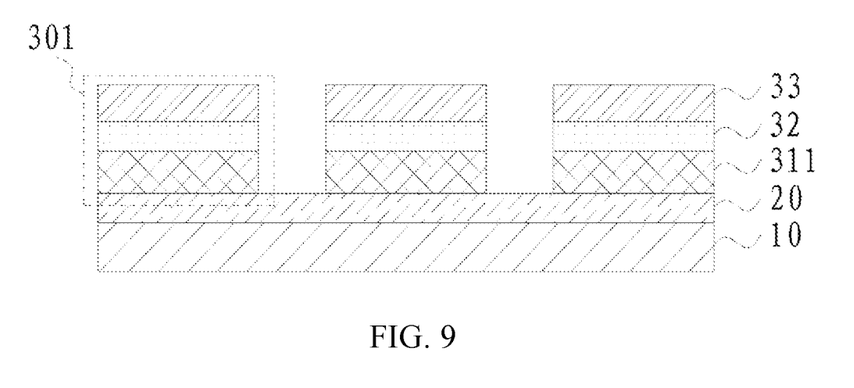
FIG. 9 is a structural diagram of a stretchable display panel after removing a protective film provided in the embodiments of the present disclosure.

Reference is made to FIG. 9. The protective film 70 on the stretchable display panel 30 is then removed.

Reference is made to FIG. 4. Finally, the second support layer 50 is bonded to the second side of the stretchable display panel 30 with the second curing adhesive layer 40. The second curing adhesive layer 40 fills the hollow area 313 between the pixel island 301 and the connection bridge 302, and covers the surface located on the second side of the stretchable display panel 30. At this time, the first curing adhesive layer 20 is not cured yet, and has fluidity and stretching property. Specifically, the second curing adhesive layer 40 may be an OCA adhesive material. The second curing adhesive layer 40 can also be OCR liquid optical adhesive for bonding an uneven surface. The first support layer 10 is preferably a thermoplastic A-PET sheet.

Figure 10:
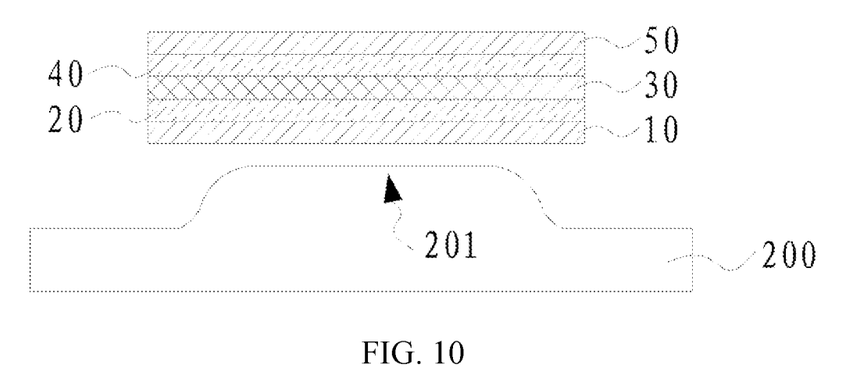
FIG. 10 and FIG. 11 are schematic diagrams of a curved display module that is performed with a thermoforming process provided in the embodiments of the present disclosure.
Figure 11:
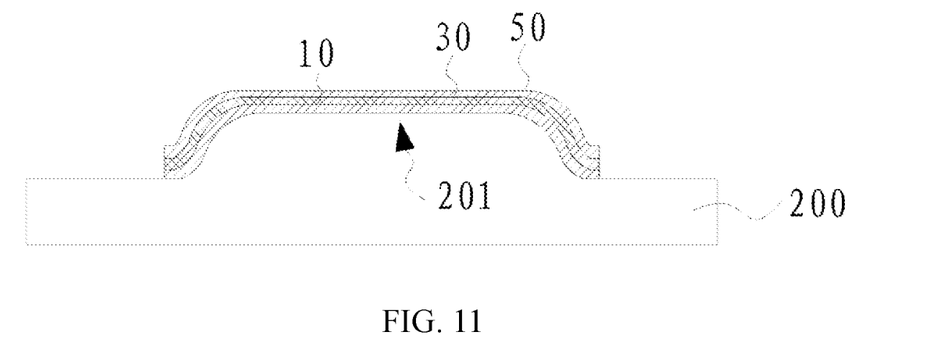

References are made to FIG. 10 and FIG. 11. After the first support layer 10 and the second support layer 50 are bonded with the stretchable display panel 30, a thermoforming process is further required to perform on the stretchable display panel 30 to form a curved display module 100 with the fixed curvature.

Specifically, as shown in FIG. 10, the thermoforming process includes: first, the display module formed by bonding the stretchable display panel 30 with the second support layer 50 and the first support layer 10 is placed on a first surface 201 of a hot bending mould 200, and both ends of the stretchable display panel 30 are clamped with a clamp so that the stretchable display panel 30 is fixed, in which the first surface 201 is a surface with different radius of curvature; next, the stretchable display panel 30 is heated; then, the pressure is applied to the stretchable display panel 30, so that the stretchable display panel 30 is attached to the first surface 201; finally, the stretchable display panel 30 is cooled.

When the heating temperature of the second support layer 50 and the first support layer 10 reaches a softening temperature, the second support layer 50 and the first support layer 10 are in a high elastic-plastic state. The pressure can be applied at this time, so that the display module bend and extend along the first surface 201. The display module is closely attached to the first surface 201 of the hot bending die 200, and obtain the same shape as the first surface 201 finally. The connection bridges of the stretchable display panel 30 corresponding to different areas are stretched in different degrees.

After the display module is cooled, the second support layer 50, the first support layer 10, the first curing adhesive layer 20, and the second curing adhesive layer 40 are cured, and the second support layer 50, the first support layer 10, the first curing adhesive layer 20, and the second curing adhesive layer 40 maintain the shape formed in hot bending forming. Since the stretchable display panel 30 is sandwiched between the second support layer 50 and the first support layer 10, the stretchable display panel 30 also maintains the same bending shape, thereby realize the manufacture of the curved display module 100 with the fixed curvature.

In the embodiments of the present disclosure, the curved display module 100 with four-sided curved display is taken as an example. Reference is made to FIG. 2. The second stretching area 102 surrounds the first stretching area 101, and the second stretching area 102 and the first stretching area 101 are located in different planes. The second stretching area 102 includes four stretching zones, and an angle formed between any one of the stretching zones located at four sides of the first stretching area and the first stretching area is not zero.

Specifically, the stretching strength of the first stretching area 101 is zero, and the stretching strength of the second stretching area 102 is greater than zero. That is, the first stretching area 101 does not stretch, and the second stretching area 102 stretches. The second stretching area 102 is bent and deformed into a curved surface under pressure. The stretching strength mentioned in the present embodiment is with respect to the stretchable display panel which is not subject to any tensile stress before thermoforming.

During the thermoforming process, the method of applying pressure to the curved display module 100 includes any of vacuumizing, introducing the compressed air, applying mechanical pressure or hydraulic pressure. Specifically, it can be realized by vacuumizing from the bottom of the heated mould, by introducing the compressed air into the top of the curved display module 100, or by other forms of mechanical pressure or hydraulic pressure.

It can be understood that for a person of ordinary skill in the art, equivalent replacement or changes can be made according to the technical solutions and the inventive concepts of the present disclosure, and all these changes or replacements shall fall within the scope of the following claims of the present disclosure.

What is claimed is:

1. A curved display module comprising a display area, wherein the curved display module comprises:
   a stretchable display panel comprising a plurality of pixel islands configured for carrying light-emitting units and a connection bridge configured for connecting adjacent two of the pixel islands; and
   a first support layer disposed on a first side of the stretchable display panel;
   wherein the display area comprises a first stretching area and a second stretching area, when the curved display module is not subjected to an external force, a stretching degree of the connection bridge in the first stretching area is less than a stretching degree of the connection bridge in the second stretching area;
   when the curved display module is not subjected to the external force, a distance between the adjacent two of the pixel islands in the first stretching area is less than a distance between the adjacent two of the pixel islands in the second stretching area;
   when the curved display module is not subjected to the external force, a stretching degree of a portion of the first support layer located in the first stretching area is less than a stretching degree of a portion of the first support layer located in the second stretching area.

2. The curved display module according to claim 1, wherein a length of the connection bridge between the adjacent two of the pixel islands in the first stretching area is equal to a length of the connection bridge between the adjacent two of the pixel islands in the second stretching area.

3. The curved display module according to claim 1, wherein a plurality of connection lines are disposed on the connection bridge, and the connection lines are electrically connected with pixel driving circuits in the adjacent two of the pixel islands, wherein when the curved display module is not subjected to the external force, stretching degrees of the connection lines in the first stretching area are less than stretching degrees of the connection lines in the second stretching area.

4. The curved display module according to claim 3, wherein lengths of the connection lines between the adjacent two of the pixel islands in the first stretching area are equal to lengths of the connection lines between the adjacent two of the pixel islands in the second stretching area.

5. The curved display module according to claim 1, wherein the curved display module further comprises:
   a second support layer disposed on a second side of the stretchable display panel opposite the first side;
   when the curved display module is not subjected to the external force, a stretching degree of a portion of the second support layer located in the first stretching area is less than a stretching degree of a portion of the second support layer located in the second stretching area.

6. The curved display module according to claim 5, wherein the first support layer and the second support layer are thermoplastic substrates.

7. The curved display module according to claim 5, wherein the stretchable display panel comprises a substrate disposed on a side of the first support layer, and the substrate comprises substrate islands located on the pixel islands, a substrate bridge located on the connection bridge, and a hollow area located between one of the substrate islands and the substrate bridge, wherein each of the pixel islands comprises one of the substrate islands, and a pixel driving circuit and one of the light-emitting units which are stacked on the one of the substrate islands in order, wherein the connection bridge comprises the substrate bridge and a plurality of connection lines disposed on the substrate bridge, and the connection lines are electrically connected with the pixel driving circuits on the adjacent two of the substrate islands.

8. The curved display module according to claim 7, wherein the curved display module further comprises a first curing adhesive layer configured for bonding the stretchable display panel and the first support layer, and a second curing adhesive layer configured for bonding the stretchable display panel and the second support layer, wherein at least one of the first curing adhesive layer and the second curing adhesive layer is further filled in the hollow area.

9. The curved display module according to claim 1, wherein the second stretching area surrounds the first stretching area, when the curved display module is not subjected to the external force, a stretching degree of the first stretching area is zero, and a stretching degree of the second stretching area is greater than zero.

10. A curved display module comprising a display area, wherein the curved display module comprises:
    a stretchable display panel comprising a plurality of pixel islands configured for carrying light-emitting units and a connection bridge configured for connecting adjacent two of the pixel islands; and
    a first support layer disposed on a first side of the stretchable display panel;
    wherein the display area comprises a first stretching area and a second stretching area, when the curved display module is not subjected to an external force, a stretching degree of the connection bridge in the first stretching area is less than a stretching degree of the connection bridge in the second stretching area.

11. The curved display module according to claim 10, wherein when the curved display module is not subjected to the external force, a distance between the adjacent two of the pixel islands in the first stretching area is less than a distance between the adjacent two of the pixel islands in the second stretching area.

12. The curved display module according to claim 11, wherein a length of the connection bridge between the adjacent two of the pixel islands in the first stretching area is equal to a length of the connection bridge between the adjacent two of the pixel islands in the second stretching area.

13. The curved display module according to claim 11, wherein a plurality of connection lines are disposed on the connection bridge, and the connection lines are electrically connected with pixel driving circuits in the adjacent two of the pixel islands, wherein when the curved display module is not subjected to the external force, stretching degrees of the connection lines in the first stretching area are less than stretching degrees of the connection lines in the second stretching area.

14. The curved display module according to claim 13, wherein lengths of the connection lines between the adjacent two of the pixel islands in the first stretching area are equal to lengths of the connection lines between the adjacent two of the pixel islands in the second stretching area.

15. The curved display module according to claim 10, wherein when the curved display module is not subjected to the external force, a stretching degree of a portion of the first support layer located in the first stretching area is less than a stretching degree of a portion of the first support layer located in the second stretching area.

16. The curved display module according to claim 15, wherein the curved display module further comprises:
    a second support layer disposed on a second side of the stretchable display panel opposite the first side;
    when the curved display module is not subjected to the external force, a stretching degree of a portion of the second support layer located in the first stretching area is less than a stretching degree of a portion of the second support layer located in the second stretching area.

17. The curved display module according to claim 16, wherein the first support layer and the second support layer are thermoplastic substrates.

18. The curved display module according to claim 16, wherein the stretchable display panel comprises a substrate disposed on a side of the first support layer, and the substrate comprises substrate islands located on the pixel islands, a substrate bridge located on the connection bridge, and a hollow area located between one of the substrate islands and the substrate bridge, wherein each of the pixel islands comprises one of the substrate islands, and a pixel driving circuit and one of the light-emitting units which are stacked on the one of the substrate islands in order, wherein the connection bridge comprises the substrate bridge and a plurality of connection lines disposed on the substrate bridge, and the connection lines are electrically connected with the pixel driving circuits on the adjacent two of the substrate islands.

19. The curved display module according to claim 18, wherein the curved display module further comprises a first curing adhesive layer configured for bonding the stretchable display panel and the first support layer, and a second curing adhesive layer configured for bonding the stretchable display panel and the second support layer, wherein at least one of the first curing adhesive layer and the second curing adhesive layer is further filled in the hollow area.

20. The curved display module according to claim 18, wherein an organic filling layer is disposed between the connection lines and the substrate bridge, and one side of the connection lines away from the substrate bridge are covered by an organic layer.

* * * * *